United States Patent
Li et al.

(10) Patent No.: US 9,093,465 B2
(45) Date of Patent: Jul. 28, 2015

(54) METHOD OF FABRICATING SEMICONDUCTOR DEVICE

(71) Applicant: UNITED MICROELECTRONICS CORP., Hsin-Chu (TW)

(72) Inventors: Yu-Ting Li, Chiayi (TW); Po-Cheng Huang, Kaohsiung (TW); Wu-Sian Sie, Tainan (TW); Chun-Hsiung Wang, Kaohsiung (TW); Yi-Liang Liu, Tainan (TW); Chia-Lin Hsu, Tainan (TW); Rai-Min Huang, Taipei (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 14/102,515

(22) Filed: Dec. 11, 2013

(65) Prior Publication Data

US 2015/0162419 A1    Jun. 11, 2015

(51) Int. Cl.
*H01L 21/3205* (2006.01)
*H01L 29/66* (2006.01)
*H01L 21/321* (2006.01)
*H01L 21/02* (2006.01)

(52) U.S. Cl.
CPC .... *H01L 29/66545* (2013.01); *H01L 21/02112* (2013.01); *H01L 21/02318* (2013.01); *H01L 21/3212* (2013.01); *H01L 21/32055* (2013.01)

(58) Field of Classification Search
USPC ............... 438/585, 689, 690, 691, 692, 697
See application file for complete search history.

(56) References Cited

U.S. PATENT DOCUMENTS

| | | | |
|---|---|---|---|
| 2011/0147812 A1 | 6/2011 | Steigerwald | |
| 2012/0252216 A1 | 10/2012 | Adam | |
| 2013/0307037 A1* | 11/2013 | Masuoka et al. | 257/288 |
| 2015/0021663 A1* | 1/2015 | Akarvardar et al. | 257/192 |

* cited by examiner

*Primary Examiner* — Timor Karimy
(74) *Attorney, Agent, or Firm* — Winston Hsu; Scott Margo

(57) ABSTRACT

A method of fabricating a semiconductor device includes the following steps. A substrate including at least a fin structure is provided, and a material layer is formed to cover the fin structure. Then, a first planarization process is performed on the material layer to form a first material layer, and an oxide layer is formed on the first material layer. Subsequently, the oxide layer is totally removed to expose the first material layer, and a second material layer is formed in-situ on the first material layer after totally removing the oxide layer.

11 Claims, 6 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, to a method of fabricating a semiconductor device which includes a step of removing an oxide layer on a planarized material layer and a step of re-depositing another material layer using the same process tool.

2. Description of the Prior Art

Poly-silicon has been conventionally used as a gate electrode in semiconductor devices, such as metal-oxide-semiconductors (MOS). With the trend towards scaling down semiconductor devices, however, conventional poly-silicon gates have inferior performances due to boron penetration and an unavoidable depletion effect, which increases the equivalent thickness of the gate dielectric layer, reduces the gate capacitance, and lowers a driving force of the devices. Therefore, work function metals are used to replace the conventional poly-silicon gate (which acts as a sacrificial gate) as a metal gate that is suitable for a high-k gate dielectric layer.

A poly-silicon material layer is formed on the substrate including fin structures to serve as a sacrificial gate for the later performed replacement metal gate (RMG) process, the protruded fin structures may cause non-planar surface of the poly-silicon material layer. Therefore, a chemical mechanical polishing (CMP) process needs to be performed to planarize the poly-silicon material layer to improve the reliability of the later formed semiconductor devices. Because there is no etch stop layer, the CMP process is usually modulated by a time mode. However, the process deviation, such as too long processing time or improper concentration of the slurry, of the CMP process causes the formed poly-silicon material layer to fail to meet predetermined criteria; for example, the formed poly-silicon material layer has a thickness less than a target thickness, which may further cause some wafers to be scraped to increase the manufacturing cost.

Accordingly, a method of fabricating a semiconductor device—more specifically a sacrificial gate process—that can compensate the deficiency of the sacrificial gate material layer such as the insufficient thickness after the CMP process and avoid unwanted wafer scraps to thereby reduce the manufacturing cost and improve the performance of the semiconductor device is needed in the industry.

SUMMARY OF THE INVENTION

It is one of the objectives of the present invention to provide a method of forming a semiconductor device including a sacrificial gate process, in order to form a gate material layer having a predetermined thickness, which can avoid an unwanted remaining sacrificial gate.

According to one exemplary embodiment of the present invention, a method of fabricating a semiconductor device includes the following steps. A substrate including at least a fin structure is provided, and a material layer is formed to cover the fin structure. Then, a first planarization process is performed on the material layer to form a first material layer, and an oxide layer is formed on the first material layer. Subsequently, the oxide layer is totally removed to expose the first material layer, and a second material layer is formed in-situ on the first material layer after the oxide layer is totally removed.

According to another exemplary embodiment of the present invention, a method of fabricating a semiconductor device includes the following steps. A substrate including at least a fin structure is provided, and a material layer is formed to cover the fin structure. A first planarization process is performed on the material layer to form a first material layer, and the first material layer is then completely removed. Subsequently, a second material layer is formed after completely removing the first material layer, and a second planarization process is performed on the second material layer to form a third material layer.

The present invention uses multiple material layer formation processes to form a predetermined material layer, wherein the oxide layer formed between the material layer formation processes is totally removed, and the process of removing the oxide layer and the subsequent material layer formation process after removing the oxide layer are preferably performed by the same process tool to reduce an elapsed time taken up by tool transfer and avoid unwanted oxidation. Accordingly, the formed predetermined material layer can have a predetermined thickness without an unwanted oxide layer disposed therein. Furthermore, as the formed predetermined material layer serves as a sacrificial gate in the replacement metal gate (RMG) process, the formed predetermined material layer can be totally removed and replaced by the metal gate, thereby avoiding an unwanted remaining sacrificial gate, and the performance of the formed semiconductor device is improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
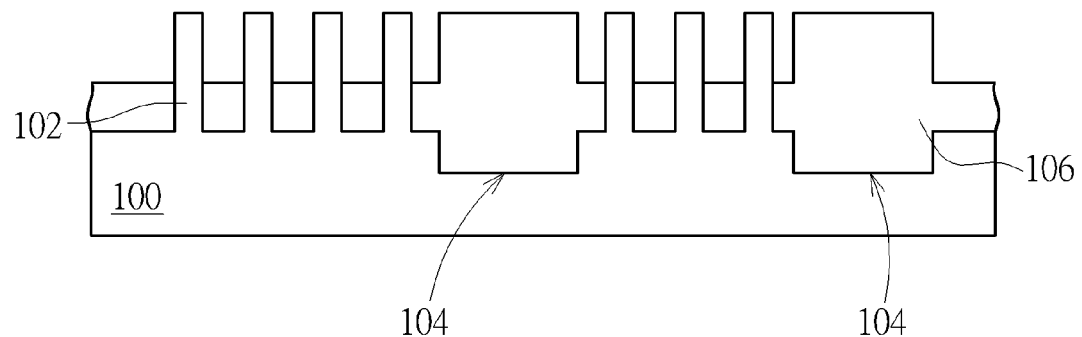
FIG. 1 through FIG. 7 illustrates a method of forming a semiconductor device according to a first exemplary embodiment of the present invention.

Please refer to FIG. 1 through FIG. 7, which illustrate a method of forming a semiconductor device according to a first exemplary embodiment of the present invention. As shown in FIG. 1, a substrate 100 is provided, wherein the substrate 100 is a bulk substrate such as a silicon substrate, an epitaxial silicon substrate, a silicon germanium substrate, a silicon carbide substrate or a substrate made of semiconductor material, but is not limited thereto. A mask layer (not shown) is formed on the substrate, wherein the mask layer includes a pad oxide layer (not shown) and a nitride layer (not shown) located on the pad oxide layer. A photolithography process is first performed to pattern the mask layer for forming a patterned pad oxide layer (not shown) and a patterned nitride layer (not shown) and exposing a part of the substrate 100. Then, an etching process can be performed on the substrate 100 by using the patterned pad oxide layer and the patterned nitride layer as a hard mask, so that at least a fin structure 102 can be formed from the part of the substrate 100 that is not etched. In another exemplary embodiment, an epitaxial process is performed to form the desired fin structures on the exposed part of the substrate 100. The fin structures 102 may protrude from the patterned pad oxide layer and the patterned nitride layer. Subsequently, some fin structures 102 can be removed and some recesses 104 can be formed in the substrate 100. An insulating layer 106 such as an oxide layer is further formed on the substrate 100 except for the part of the substrate 100 where the fin structures 102 are formed. The insulating layer 106 may be formed through processes such as a deposition process, a planarization process and an etching back process, and may be used later as a shallow trench isolation (STI) structure. Then, the patterned pad oxide layer and the patterned nitride layer are removed. Accordingly, the fin structures 102 can be formed on the substrate 100, and the insulating layer 106 can be formed on the substrate 100 except for the part of the substrate 100 where the fin structures 102 are formed.

Figure 2:
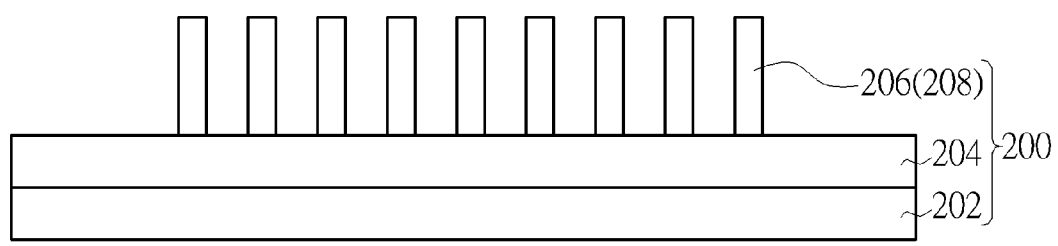

In another exemplary embodiment, as shown in FIG. 2, a substrate 200 as a silicon-on-insulator (SOI) substrate is provided, which includes a silicon substrate 202, a bottom oxide layer 204 located on the silicon substrate 202 and a silicon layer 206 located on the bottom oxide layer 204. The silicon layer 206 is patterned to form at least a fin structure 208 and a part of the bottom oxide layer 204 not overlapped by the fin structures 208 is exposed. In this way, the fin structures 208 can be formed with a fixed interval on the silicon substrate 202, and another oxide layer can be optionally disposed on the part of the silicon substrate 202 where the fin structure 208 is not formed to serve as STI structure. The differences between FIG. 1 and FIG. 2 are that the insulating layer 106 is located on the substrate 100 except for the part where the fin structure 102 is formed (as shown in FIG. 1), but the bottom oxide layer 204 formed in the silicon-on-insulator substrate 200 has the fin structures 208 located thereon (as shown in FIG. 2); moreover, the intervals between the two neighboring fin structures 102 are varied (as shown in FIG. 1), but the intervals between the two neighboring fin structures 208 are fixed (as shown in FIG. 2). These differences do not affect later semiconductor processes of the present invention. The embodiments illustrated above only serve as examples. The number or the disposition of the fin structures in the present invention can have a variety of embodiments, which are not described for the sake of simplicity. The following description is based on the fin structures 102 of the embodiment shown in FIG. 1, but the semiconductor process of the present invention can also be applied to various fin structure types of other embodiments such as the fin structures 208.

Figure 3:
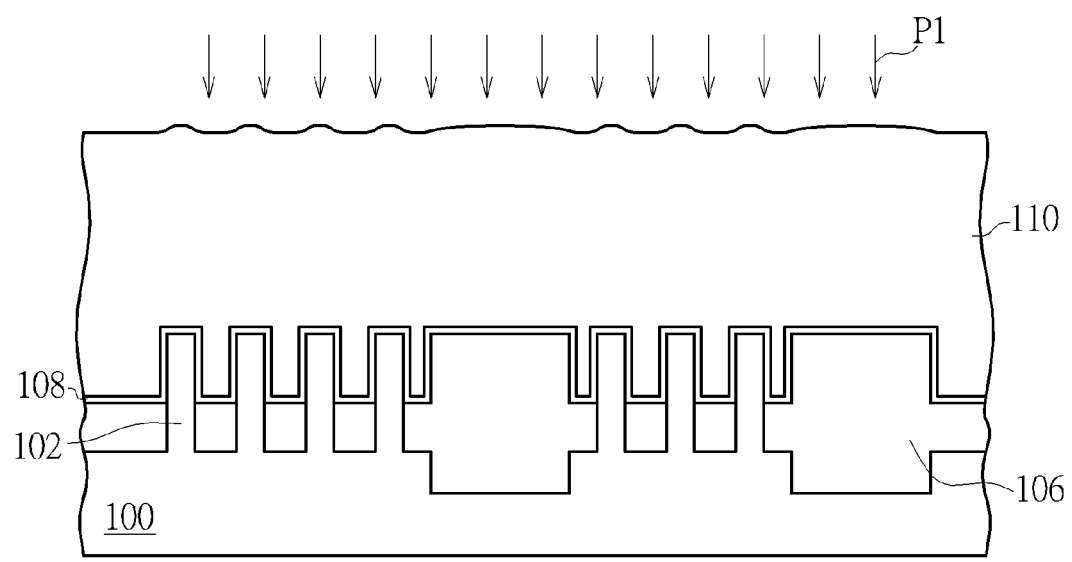

As shown in FIG. 3, a gate dielectric layer 108 and a material layer 110 are sequentially formed on the substrate 100. The material of the gate dielectric layer 108 may include silicon oxide (SiO), silicon nitride (SiN), silicon oxynitride (SiON), or a high-k dielectric material having a dielectric constant (k value) larger than 4 such as metallic oxide, etc. The metallic oxide used as the material of the gate dielectric layer 108 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The material layer 110 may serve as a sacrificial gate material layer which could be made of conductive materials such as amorphous silicon, undoped polysilicon, heavily doped polysilicon, a metal layer, or a plurality of metal layers. In this exemplary embodiment, the gate dielectric layer 108 is made of silicon oxide formed through a thermal oxidation process or a deposition process such as a chemical vapor deposition (CVD) process or an atomic layer deposition (ALD) process, and the material layer 110 is made of amorphous silicon formed through a chemical vapor deposition (CVD) process, but the process is not limited thereto.

Figure 4:
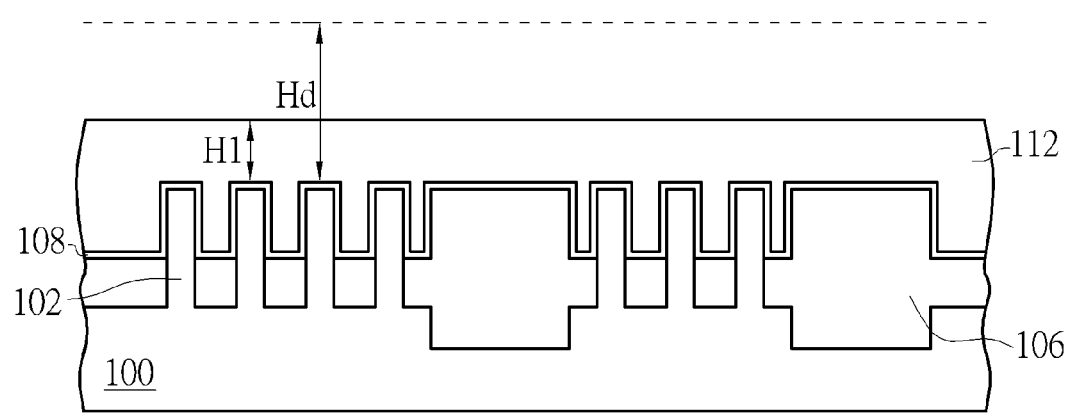

The material layer 110 has a non-planar surface due to the underneath protruded fin structures 102 disposed with different intervals (i.e. different pattern density) and the protruded part of the insulating layer 106, therefore, a first planarization process P1 such as a first chemical mechanical polishing (CMP) process is performed on the material layer 110 to form a first material layer 112 having a planar top surface, as shown in FIG. 4. If a thickness of the material layer 110 is large, an etching back process could be selectively performed before the first planarization process P1 to remove a part of the material layer 110, in order to save manufacturing consuming time for removing the excessive part of the material layer 110. The thickness of the removed material layer 110 can be modulated by a time mode, for example, by adjusting the process conditions such as the processing time of the first planarization process P1 and/or the optionally performed etching back process. The formed first material layer 112 preferably has a thickness substantially equal to a predetermined thickness Hd, however, the process deviations of the first planarization process P1 and/or the optionally performed etching back process may induce improper removal of the material layer 110. Therefore, in this exemplary embodiment, after the first planarization process P1 and the optionally performed etching back process, a first thickness H1 of the first material layer 112 is substantially less than the predetermined thickness Hd, wherein the predetermined thickness Hd corresponds to a height of a sacrificial gate predetermined to be disposed on the fin structures 102 according to process demands. A planar top of the first material layer 112 is lower than a top (indicated by dashed lines) of the sacrificial gate predetermined to be formed.

Figure 5:
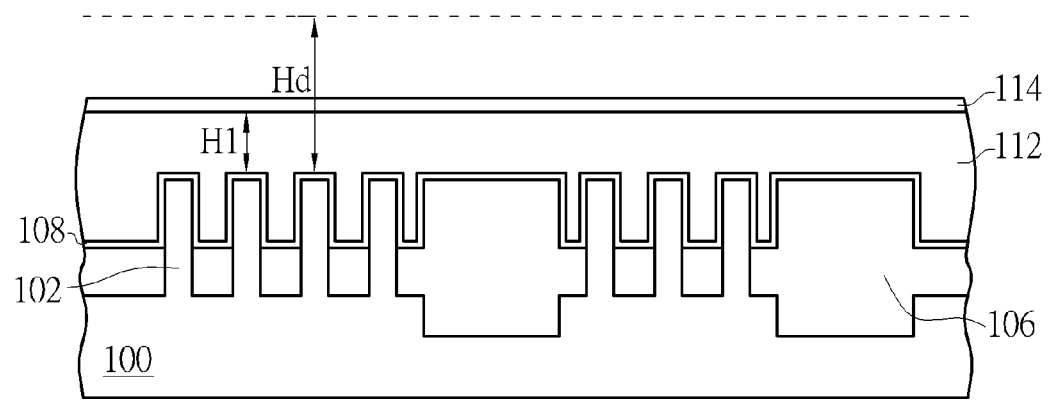

In order to obtain the planarized material layer having the predetermined thickness Hd, an additional material layer needs to be formed on the first material layer 112 to compensate for the insufficient thickness. It is noted that, as the elapsed time of the thickness measurement process or the tool transfer process is too long, an oxide layer 114 such as a native oxide layer may be formed on the first material layer 112, as shown in FIG. 5. In another exemplary embodiment, the oxide layer 114 could also be formed thorough another oxidation process or a chemical vapor deposition (CVD) process to control the thickness of the formed oxide layer 114 or reduce the surface defects of the first material layer 112. In one exemplary embodiment, the oxide layer 114 is remained to become a separated layer between the first material layer 112 and the later formed additional material layer, a removing rate of the material layer (i.e. the first material layer 112 and the additional material layer) in an etchant and a removing rate of the oxide layer 114 in the same etchant are different. In other words, the etchant used in the later etching process supposed to remove the material layer (i.e. the sacrificial gate) has the etching selectivity between the heterogeneous layers such as the material layer and the oxide layer 114, and the etching selectivity may cause unwanted material layer residue such as amorphous silicon residue on the substrate 100 due to the existence of the oxide layer 114. Thus, a process of removing the oxide layer 114 is essential to be performed before forming the additional material layer to avoid the formation of the unwanted material layer residue (sacrificial gate residue).

Figure 6:
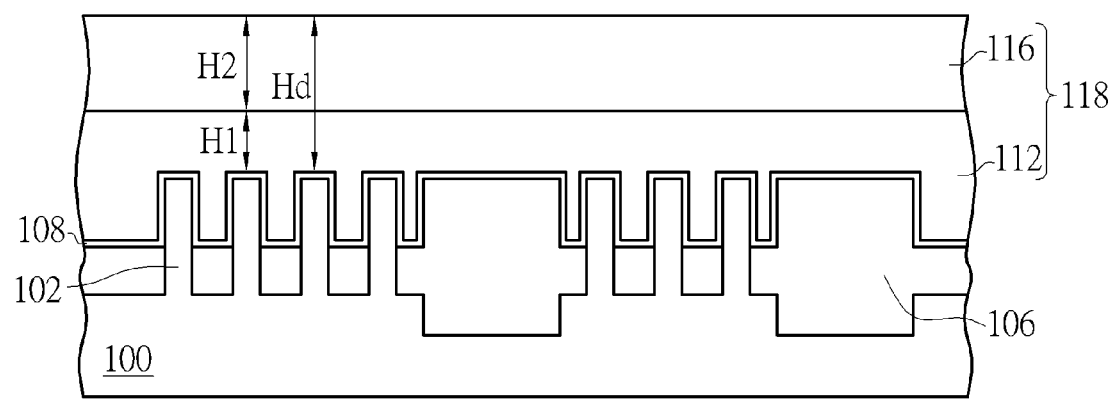

As shown in FIG. 6, an etching process is performed to totally remove the oxide layer 114 to expose the first material layer 112. The etching process could be an etching process performed by an etching tool named SiCoNi (Trademark of Applied Materials, Inc.), which can be called a SiCoNi etching process, to effectively remove the oxide layer 114 without damaging a surface of the first material layer 112. The SiCoNi etching process primarily includes the step of reacting the fluorine-containing gas with the oxide layer 114 made of silicon oxide to synthesize diammonium fluosilicate (($NH_4$)$_2$ $SiF_6$). The aforesaid fluorine-containing gas can be hydrogen fluoride (HF) or nitrogen trifluoride ($NF_3$). In this exemplary embodiment, the possible change in the chemical compositions of the SiCoNi etching process is shown as follows:

etchant generated: $NF_3 + NH_3 \rightarrow NH_4F + NH_4F \cdot HF$ etching: $NH_4F + NH_4F \cdot HF + SiO_2 \rightarrow (NH_4)_2SiF_{6(s)} + H_2O$ (wherein the substrate temperature during etching>35° C.)
annealing: $(NH_4)_2SiF_{6(s)} \rightarrow SiF_{4(g)} + NH_{3(g)} + HF_{(g)}$
(wherein the substrate temperature during annealing>100° C.)

After totally removing the oxide layer 114, the substrate 100 keeps in the same tool where the oxide layer 114 is removed and in a vacuum state to avoid unwanted oxidation (i.e. avoid the formation of the unwanted oxide layer). A deposition process such as a chemical vapor deposition (CVD) process is further performed by the same tool to form a second material layer 116 in-situ on the first material layer 112. The term "in-situ" in the present invention means without exposing the substrate 100 into the atmosphere or an oxygen-containing environment. In other words, the step of totally removing the oxide layer 114 and the step of forming the second material layer 116 are performed by the same process tool such as the SiCoNi etching tool detailed above. Furthermore, the step of totally removing the oxide layer 114 and the step of forming the second material layer 116 are ideally performed in different process chambers to simplify the inlet/outlet layout of the chambers of the process tool and avoid mutual contamination between the processes, but this is not limited thereto. The step of totally removing the oxide layer 114 and the step of forming the second material layer 116 could also be performed in the same process chamber to save on manufacturing time. A material of the first material layer 112 (material of the material layer 110) and a material of the second material layer 116 are preferably the same, such as amorphous silicon. The second material layer 116 has a second thickness H2, and a sum of the first thickness H1 and the second thickness H2 is equal to the predetermined thickness Hd. Accordingly, a planarized material layer 118 having the predetermined thickness Hd and a multi-layered structure (i.e. the first material layer 112 and the second material layer 116) without an unwanted oxide layer disposed therein (i.e. an unwanted oxide layer is not remained between the first material layer 112 and the second material layer 116) is formed on the substrate 100.

Figure 7:
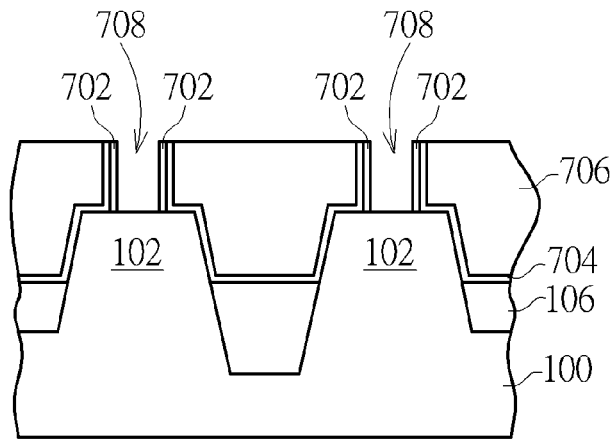

The present invention can be applied in various metal gate processes including a high-k first process integrated into the gate-last process, and a high-k last process integrated into the gate-last process. In this exemplary embodiment, the high-k last process integrated into the gate-last process is taken as an example. As shown in FIG. 7 (wherein a cross-sectional view in FIG. 7 is perpendicular to a cross-sectional view in FIG. 6), after the planarized material layer 118 having the predetermined thickness Hd is formed, a cap layer (not shown) is formed on the material layer 118, and a patterning process is performed to form the patterned gate stack layers including the patterned cap layer, the patterned material layer 118 and the patterned gate dielectric layer 108. Subsequently, sidewall spacers 702 are formed to surround the patterned gate stack layers, and source/drain regions (not shown) can be formed at two sides of the patterned gate stack layers in the fin structures 102 through ion implantation processes. During the formation of the source/drain regions, a selective epitaxial growth (SEG) process and/or a recess process can be performed to enhance stress provided by the source/drain regions to the channel region, and the channel region is in the fin structures 102 underneath the patterned gate stack layers. Furthermore, a contact etch stop layer (CESL) 704 and an inter-layer dielectric (ILD) layer 706 are formed in sequence on the substrate, and a planarization process, such as a chemical mechanical polish (CMP) process or an etching back process, can be performed to sequentially remove a part of the ILD layer 706, a part of the CESL 704, a part of the sidewall spacers 702 and the overall cap layer, until the patterned material layer 118 (i.e. the sacrificial gate) is exposed. The exposed patterned material layer 118 and the patterned gate dielectric layer 108 surrounded by the sidewall spacers 702 are then removed to form recesses 708, and a plurality of metal layers (not shown) such as a high-k gate dielectric layer, a single-layered or multi-layered work function metal layer, a barrier layer and a low-resistance metal layer are formed to fill the recesses 708. After completing the replacement metal gate (RMG) process, the formed semiconductor device may have a metal gate. It should be noted that, the material layer 118 having the predetermined thickness Hd includes multiple layers of the same material (i.e. the first material layer 112 and the second material layer 116, which are both made of amorphous silicon) rather than heterogeneous layers, such as an unwanted oxide layer 114 between the first material layer 112 and the second material layer 116. Therefore, the material layer 118 can be completely removed without leaving any unwanted material layer residue (such as an unwanted remaining sacrificial gate) in the recesses 708.

The method of fabricating a semiconductor device of the present invention is not limited to the illustrated exemplary embodiment. To simplify the explanation and to clarify any comparison between embodiments, the same components are denoted by the same numerals in the following exemplary embodiments or derivative embodiments, and repeated aspects are omitted herein for brevity.

Figure 8:
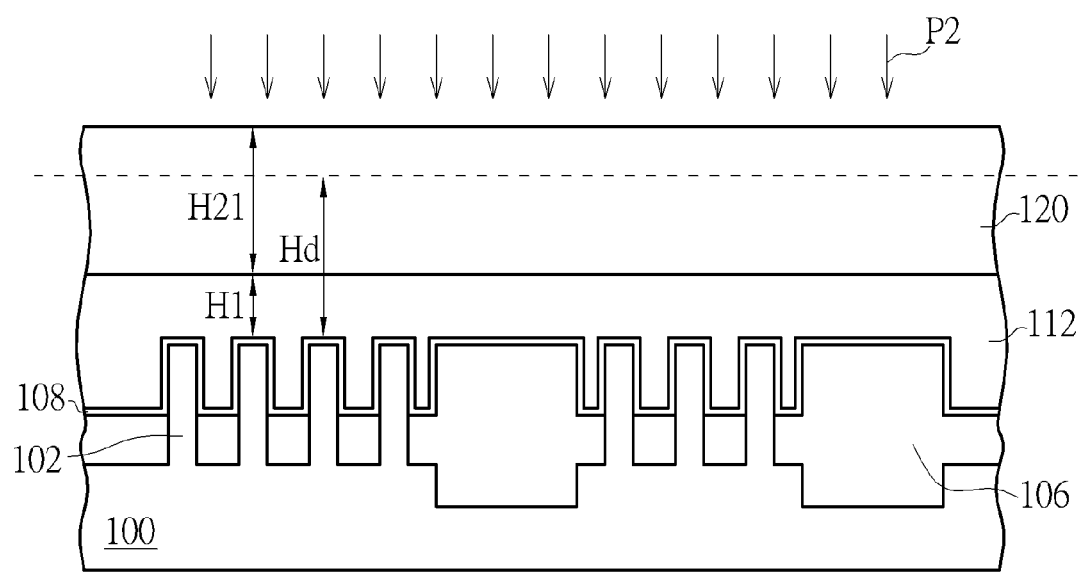
FIG. 8 through FIG. 9 illustrates a method of forming a semiconductor device according to a second exemplary embodiment of the present invention.
Figure 9:
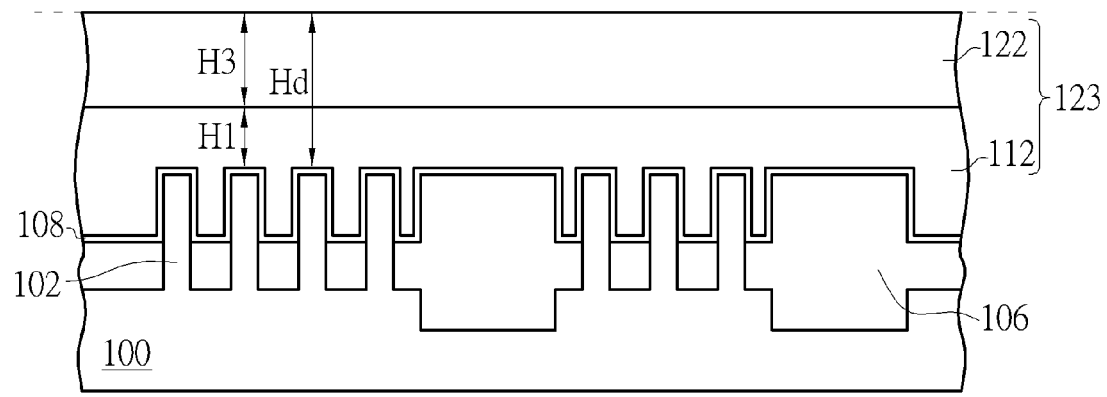

Please refer to FIG. 8 through FIG. 9, which illustrate a method of forming a semiconductor device according to a second exemplary embodiment of the present invention. As shown in FIG. 8 (please also refer to FIG. 5), a second material layer 120 is formed in-situ on the first material layer 112 after totally removing the oxide layer 114. Similarly, the step of totally removing the oxide layer 114 and the step of forming the second material layer 120 are performed by the same process tool. The difference between the first exemplary embodiment and the second exemplary embodiment is the thickness of the second material layers 116/120. In this exemplary embodiment, the first material layer 112 has a first thickness H1 which is less than the predetermined thickness Hd, the second material layer 120 has a second thickness H21, and a sum of the first thickness H1 and the second thickness H21 is greater than the predetermined thickness Hd. Therefore, an etching back process could be optionally performed on the second material layer 120, and a second planarization process P2 such as a second chemical mechanical polishing (CMP) process is performed on the second material layer 120 to form a third material layer 122. As shown in FIG. 9, the third material layer 122 has a third thickness H3, and a sum of the first thickness H1 and the third thickness H3 is equal to the predetermined thickness Hd. Accordingly, a planarized material layer 123 having the predetermined thickness Hd and a multi-layered structure (the first material layer 112 and the third material layer 122) without an unwanted oxide layer disposed therein is formed on the substrate 100.

Figure 10:
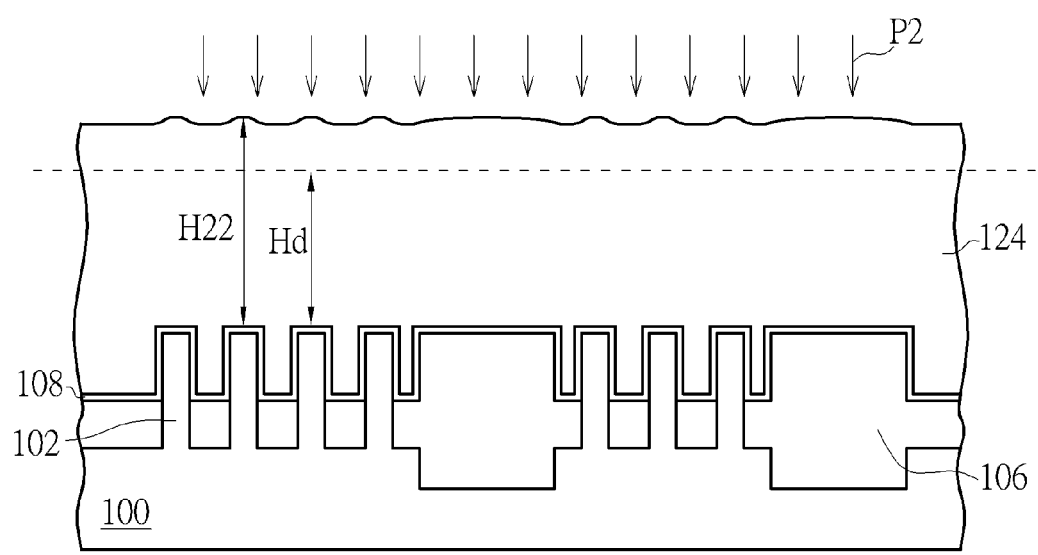
FIG. 10 through FIG. 11 illustrates a method of forming a semiconductor device according to a third exemplary embodiment of the present invention.
Figure 11:
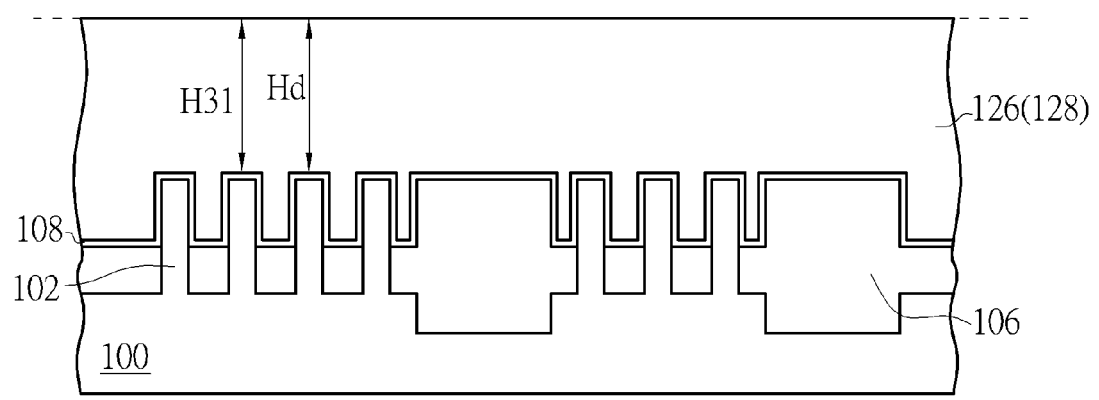

Please refer to FIG. 10 through FIG. 11, which illustrate a method of forming a semiconductor device according to a third exemplary embodiment of the present invention. As shown in FIG. 10 (please refer to FIG. 5), a single removing process or multiple removing processes can be performed to totally remove the oxide layer 114 and completely remove the first material layer 112, and the gate dielectric layer 108 is exposed after totally removing the first material layer 112. In this exemplary embodiment, a SiCoNi etching process wherein the process gas includes nitrogen trifluoride ($NF_3$) and ammonia ($NH_3$) is performed to totally remove the oxide layer 114 made of silicon oxide, and another etching process wherein the process gas includes tetramethylammonium hydroxide ($N(CH_3)_4OH$, TMAH) and hydrogen oxide ($H_2O$) is performed to completely remove the first material layer 112 made of amorphous silicon, that is, an etchant used in the process of removing the oxide layer 114 and an etchant used in the process of removing the first material layer 112 have different etching selectivity, but the process is not limited thereto.

After totally removing the oxide layer 114 and completely removing the first material layer 112, a second material layer 124 made of conductive materials such as amorphous silicon, undoped polysilicon, heavily doped polysilicon, one metal layer or a plurality of metal layers is formed to re-deposit on the gate dielectric layer 108 through a deposition process. A material of the second material layer 124 is preferably the same as the material of the first material layer 112 (i.e. the material of the first material layer 110). In this exemplary embodiment, a thickness H22 of the second material layer 124 made of amorphous silicon is substantially greater than the predetermined thickness Hd, but is not limited thereto. Similarly, the step of totally removing the oxide layer 114, the step of completely removing the first material layer 112 and the step of forming the second material layer 124 are preferably in-situ performed by the same process tool. The difference between the first/second exemplary embodiment and the third exemplary embodiment is the thickness of the second material layer 116/120/124 and the existence of the first material layer 112 before forming the second material layer 116/120/124. Moreover, in another exemplary embodiment, if the re-deposited second material layer has a thickness equal to the predetermined thickness Hd and a planar top surface, the following planarization process could be omitted.

In order to reduce the excessive second material layer 124 (a part of the second material layer 124 which is more than the predetermined thickness Hd) and planarize the second material layer 124, a second planarization process P2 such as a second chemical mechanical polishing (CMP) process is further performed on the non-planar second material layer 124 to form a planar third material layer 126. As shown in FIG. 11, the formed third material layer 126 has a third thickness H31 equal to the predetermined thickness Hd, that is, a top of the third material layer 126 is higher than a top of the previously formed first material layer 112 (as shown in FIG. 4). Accordingly, a planarized material layer 128 having the predetermined thickness Hd and a single-layered structure (the third material layer 126) without an unwanted oxide layer disposed therein is formed on the substrate 100.

In conclusion, the present invention uses multiple material layer formation processes to form a predetermined material layer, wherein the oxide layer formed between the material layer formation processes is totally removed, and the process of removing the oxide layer and the subsequent material layer formation process after removing the oxide layer are preferably performed by the same process tool to reduce an elapsed time take up by tool transfer. Accordingly, the formed predetermined material layer can have a predetermined thickness without an unwanted oxide layer disposed therein. Furthermore, as the formed predetermined material layer serves as a sacrificial gate in the replacement metal gate (RMG) process, the formed predetermined material layer can be totally removed and replaced by the metal gate, therefore, an unwanted remaining sacrificial gate can be avoided, which improves the performance of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a substrate, wherein the substrate comprises at least a fin structure;
   forming a material layer covering the fin structure;
   performing a first planarization process on the material layer to form a first material layer;
   forming an oxide layer on the first material layer;
   totally removing the oxide layer to expose the first material layer; and
   forming a second material layer in-situ on the first material layer after totally removing the oxide layer, wherein a material of the material layer and a material of the second material layer are the same.

2. The method of fabricating a semiconductor device according to claim 1, wherein the step of totally removing the oxide layer and the step of forming the second material layer are performed by the same process tool.

3. The method of fabricating a semiconductor device according to claim 1, wherein the first planarization process comprises a first chemical mechanical polishing (CMP) process.

4. The method of fabricating a semiconductor device according to claim 1, wherein the first material layer has a first thickness, and the first thickness is less than a predetermined thickness.

5. The method of fabricating a semiconductor device according to claim 4, wherein the second material layer has a second thickness, and a sum of the first thickness and the second thickness is equal to the predetermined thickness.

6. The method of fabricating a semiconductor device according to claim 1, further comprising performing a second planarization process on the second material layer to form a third material layer.

7. The method of fabricating a semiconductor device according to claim 6, wherein the first material layer has a first thickness which is less than a predetermined thickness, the second material layer has a second thickness, and a sum of the first thickness and the second thickness is greater than the predetermined thickness.

8. The method of fabricating a semiconductor device according to claim 7, wherein the third material layer has a third thickness, and a sum of the first thickness and the third thickness is equal to the predetermined thickness.

9. The method of fabricating a semiconductor device according to claim 6, wherein the second planarization process comprises a second chemical mechanical polishing (CMP) process.

10. The method of fabricating a semiconductor device according to claim 1, wherein the material of the material layer and the material of the second material layer comprise amorphous silicon.

11. The method of fabricating a semiconductor device according to claim 1, wherein the step of totally removing the oxide layer comprises performing an etching process, and a process gas used in the etching process comprises nitrogen trifluoride ($NF_3$) and ammonia ($NH_3$).

* * * * *